US006392449B1

(12) United States Patent
Taft

(10) Patent No.: US 6,392,449 B1
(45) Date of Patent: May 21, 2002

(54) HIGH-SPEED LOW-POWER LOW-OFFSET HYBRID COMPARATOR

(75) Inventor: Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/755,551

(22) Filed: Jan. 5, 2001

(51) Int. Cl.[7] .............................................. G01R 19/00
(52) U.S. Cl. .............................. 327/55; 327/57; 327/63
(58) Field of Search ................................ 327/52, 55, 56, 327/57, 63, 65, 77, 90, 93, 96, 563; 365/205, 207; 330/252, 253, 254

(56) References Cited

U.S. PATENT DOCUMENTS

| 5,272,395 A | 12/1993 | Vincelette | 327/63 |
| 5,325,335 A | * 6/1994 | Ang et al. | 365/205 |
| 5,455,816 A | * 10/1995 | Bitting | 330/252 |
| 5,621,340 A | * 4/1997 | Lee et al. | 327/65 |
| 5,668,486 A | 9/1997 | Brehmer | 327/66 |
| 5,872,467 A | 2/1999 | Huang | 327/63 |
| 6,046,612 A | 4/2000 | Taft | 327/77 |
| 6,060,912 A | 5/2000 | Opris et al. | 327/57 |
| 6,144,231 A | 11/2000 | Goldblatt | 327/57 |

OTHER PUBLICATIONS

McCarroll et al., "A High–Speed CMOS Comparator for Use in an ADC," *IEEE J. Solid–State Circuits*:23(1), Feb. 1988, pp. 159–165.

Wu et al., "A 100–MHz Pipelined CMOS Comparator," *IEEE J. Solid–State Circuits*: 23(6), Dec. 1988, pp. 1379–1385.

Yin et al., "A High–Speed CMOS Comparator with 8–b Resolution," *IEEE J. Solid–State Circuits*:27(2), Feb. 1992, pp. 208–211.

* cited by examiner

Primary Examiner—Matthew Smith
Assistant Examiner—Paul Dinh
(74) Attorney, Agent, or Firm—Merchant & Gould P.C.; Mark R. Hennings

(57) ABSTRACT

A comparator circuit includes a regenerative stage that uses a relatively small quiescent current combined with a relatively large dynamic current to charge a common-source node in the regenerative stage. The quiescent current helps maintain the common-source node in the regenerative stage near a desired charged level. The comparator circuit can also include an input isolation circuit to eliminate charge kickback to the input signal lines.

15 Claims, 6 Drawing Sheets

HIGH-SPEED LOW-POWER LOW-OFFSET HYBRID COMPARATOR

FIELD OF THE INVENTION

The present invention relates to comparator circuits and, more particularly, to high-speed CMOS only comparator circuits.

BACKGROUND INFORMATION

Comparator circuits are frequently employed in analog-to-digital conversion (ADC) circuits to compare one input signal with another. Typically, one input signal is a voltage that is compared to a reference voltage. Some comparator circuits use input capacitors as in, for example, the comparator circuit disclosed in U.S. Pat. No. 6,046,612 entitled "Self-Resetting Comparator Circuit and Method" issued Apr. 4, 2000. Although the disclosed comparator circuit represents a significant improvement to prior comparator circuits, the input capacitors cause the comparator circuit to occupy a relatively large area and have a relatively large input capacitive load.

Conventional comparator circuits that do not use input capacitors include quiescent comparators and dynamic comparators. These comparators typically have a "regenerative" stage or subcircuit that compares the input signals using a pair of MOS transistors in a common-source configuration. Quiescent comparators typically provide a continuous quiescent current in the regenerative stage to bias the common-source node, which causes the quiescent comparator to continuously dissipate a significant amount of current while the circuit is powered. Further, the speed of regeneration is typically directly proportional to the magnitude of the quiescent current. Therefore, a high-speed quiescent comparator generally has a relatively high power dissipation.

Dynamic comparators do not use a quiescent current, but rather employ a dynamic current to briefly activate the regenerative stage to compare the input signals. Therefore, dynamic comparators tend to have a lower power dissipation than quiescent comparators. However, dynamic comparators typically have a delay to allow the dynamic current to charge the common-source node before starting regeneration. This delay undesirably reduces the regeneration speed. Further, regeneration causes relatively large transient currents to flow through the source-coupled MOS transistors in the regenerative stage. These transient currents can cause significant dynamic errors in the differential output signal generated by the regenerative stage, which are in addition to the static errors caused by mismatch of the devices in the regenerative stage.

SUMMARY

In accordance with aspects of the present invention, a comparator circuit is provided. In one aspect of the present invention, the comparator circuit includes a regenerative stage that uses a relatively small quiescent current combined with a relatively large dynamic current to charge a common-source node in the regenerative stage. Using the relatively small quiescent current allows the comparator circuit to dissipate less power than the aforementioned quiescent comparators. However, by providing the quiescent current, the common-source node in the regenerative stage is maintained near the desired charged level. This maintenance of the common-source node significantly reduces the delay needed before regeneration can proceed, compared to the aforementioned dynamic comparators.

In a further aspect of the present invention, the comparator circuit includes a dynamic bandgap reference that provides a biasing signal to the regenerative stage that increases the quiescent current with increased frequency of a clock signal driving the dynamic bandgap reference. This aspect can be advantageously used to adjust the regeneration speed. That is, by increasing the quiescent current, the regeneration speed is increased, but at the cost of higher power dissipation. Some applications may have low-speed and high-speed operational modes. This aspect of the present invention allows the comparator circuit to save power during low-speed mode operation by appropriate control of the dynamic bandgap reference.

In another aspect of the present invention, the comparator circuit includes an input isolation circuit to eliminate charge kick-back to the input signal lines from the source-coupled MOS transistors. Shortly after regeneration begins, the isolation circuit isolates the gates of the source-coupled pair from the input signals. The isolation circuit provides fixed reference signals to the gates of the source-coupled pair, isolated from the input lines that carry the input signals. For example, with a PMOS source-coupled pair, switches are opened to disconnect the gates of the source-coupled pair from the lines carrying the input signals. In addition, the gates are connected to the ground bus, thereby preventing the gate voltages from becoming negative. The isolation circuit allows the comparator circuit to have a more consistent and fast regeneration speed.

DETAILED DESCRIPTION

Figure 1:
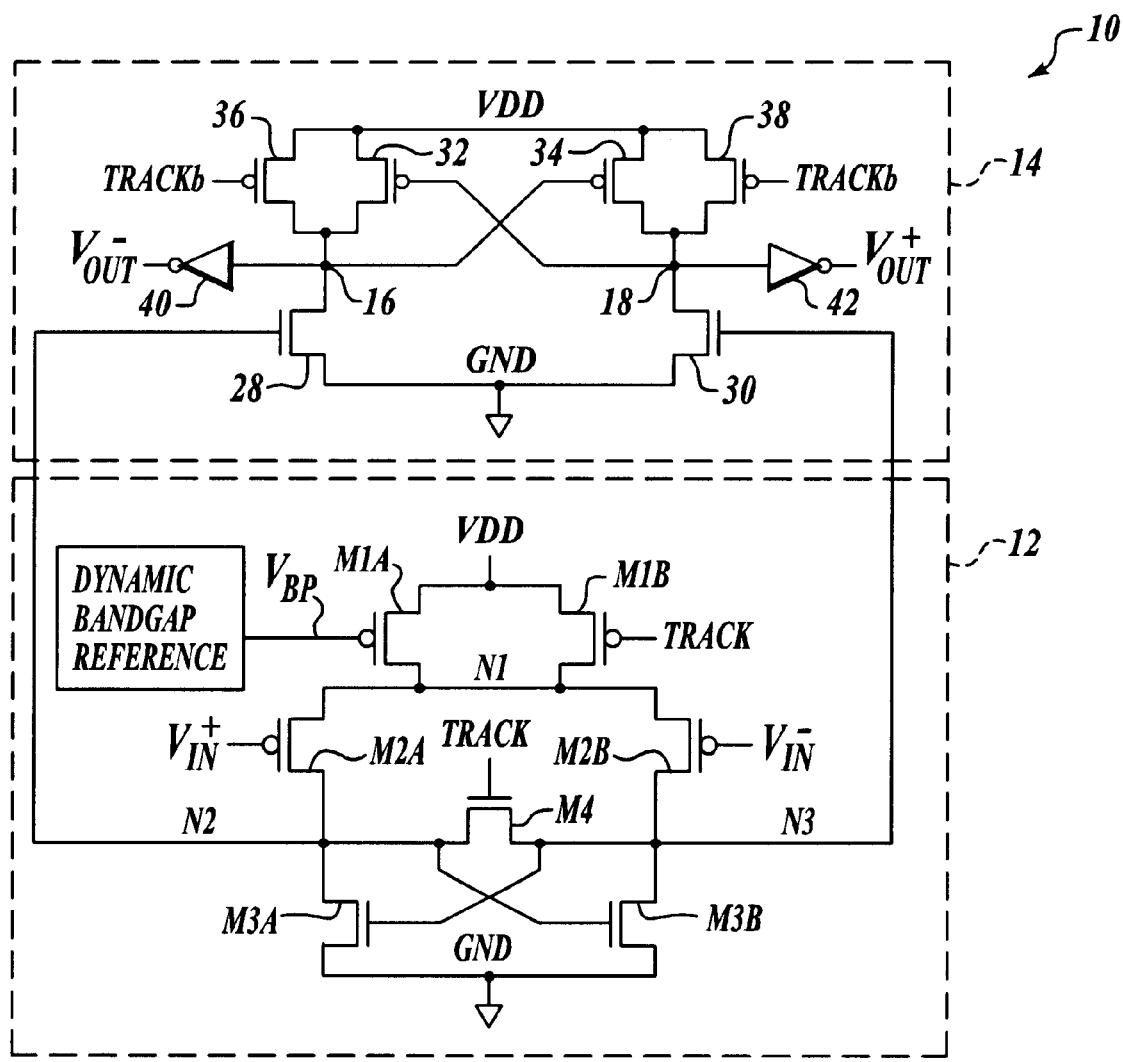
FIG. 1 is a diagram illustrating a comparator circuit according to one embodiment of the present invention.
Figure 2A:
FIG. 2 is a diagram illustrating signals provided to the comparator circuit of FIG. 1 during operation.
Figure 2B:
Figure 2C:
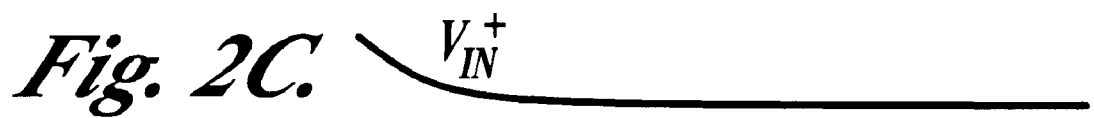
Figure 2D:

FIG. 1 illustrates a comparator circuit 10, according to one embodiment of the present invention. Comparator circuit 10 includes a regenerative stage 12 and an output latch stage 14. In accordance with the present invention, regenerative stage 12 includes a common-source node N1 and uses a relatively small quiescent current and a relatively large dynamic current to charge node N1 to achieve a fast regeneration speed with low power dissipation. Although particular embodiments of regenerative stage 12 and output latch stage 14 are described below, in view of this disclosure other embodiments can be implemented by those skilled in the art of comparator circuits without undue experimentation.

In this embodiment, output latch stage 14 includes P-channel transistors 32, 34, 36 and 38, N-channel transistors 28 and 30, and inverters 40 and 42, which are interconnected as follows. P-channel transistors 32, 34, 36, and 38 have their sources connected to power bus VDD. The drains of P-channel transistors 32 and 36 are connected to a node 16. The drains of P-channel transistors 34 and 38 are connected to a node 18. The gates of P-channel transistors 36 and 38 are connected to receive a control signal TRACKb. The gates of P-channel transistors 32 and 34 are connected to nodes 18 and 16, respectively. The input leads of inverters 40 and 42 are connected to nodes 16 and 18 respectively. N-channel transistor 28 has its drain connected to node 16, its gate connected to regenerative stage 12 at a node N2, and its source connected to ground bus GND. N-channel transistor 30 has its drain connected to node 18, its gate connected to regenerative stage 12 at a node N3, and its source connected to ground bus GND.

Regenerative stage 12, in this embodiment, includes P-channel transistors M1A, M1B, M2A, M2B, and N-channel transistors M3A, M3B and M4. Ideally, transistors M1A and M1B match each other, M2A and M2B match each other, and M3A and M3B match each other. These transistors are interconnected in regenerative stage 12 as follows. P-channel transistor M1A has its source connected to power bus VDD, its gate connected to receive a biasing signal $V_{BP}$, and its drain connected to a node N1. Biasing signal $V_{BP}$ is provided by a dynamic bandgap reference. P-channel transistor M1A serves as a current source for the aforementioned quiescent current used to charge node N1. P-channel transistor M1B has its source connected to power bus VDD, its gate connected to receive a control signal TRACK (i.e., control signal TRACKb is the complement of control signal TRACK), and its drain connected to node N1. P-channel transistor M1B serves as a current source for the aforementioned dynamic current used to charge node N1 during regeneration. Consequently, comparator circuit 10 is in effect a hybrid comparator in that it uses both a quiescent current and a dynamic current.

P-channel transistors M2A and M2B are connected in a common-source configuration to receive a differential input signal. In particular, P-channel transistors M2A and M2B respectively have their sources connected to node N1, their gates connected to receive input signals $V_{IN}+$ and $V_{IN}-$, and their drains connected to regenerative nodes N2 and N3. N-channel transistors M3A and M3B respectively have their sources connected to ground bus GND, their gates connected to nodes N3 and N2, and their drains connected to nodes N2 and N3. N-channel transistor M4 is connected as a switch between nodes N2 and N3, with its gate connected to receive control signal TRACK.

Bias signal $V_{BP}$ is set to a level that causes P-channel transistor M1A to conduct a desired quiescent current to node N1. In one embodiment, this quiescent current is about 50 uA (with P-channel transistors M2A and M2B of size W=16 um and L=0.6 um). In other embodiments, the quiescent current can range from less than 1 uA to over 1 mA. This quiescent current maintains the voltage at node N1 relatively high. This high voltage allows the dynamic current provided by P-channel transistor M1B to more quickly charge node N1, which in turn increases the regeneration speed. However, because the quiescent current is relatively small, the increased regeneration speed is achieved with only a small increase in power dissipation. As previously described, increasing the quiescent current increases regeneration speed, but at the expense of increasing power dissipation. Thus, in applications having modes with different comparison speed requirement, bias signal $V_{BP}$ can be set to provide a gate-to-source voltage with a relatively low magnitude for a low speed mode and provide a gate-to-source voltage with a relatively high magnitude for a high speed mode. In one embodiment, a dynamic bandgap reference is used so that bias signal $V_{BP}$ can be varied in this manner.

FIG. 2 illustrates examples of signals TRACK, TRACKb, $V_{IN}+$ and $V_{IN}-$ provided to comparator circuit 10 (FIG. 1) during operation. Referring to FIGS. 1 and 2, comparator circuit 10 operates as follows. Control signals TRACK and TRACKb are generated by a timing circuit (not shown). The interval in which control signal TRACK is at a logic low level is referred to herein as the regeneration interval. To minimize power dissipation, the regeneration interval is set to be as short as possible while allowing enough time for comparator circuit 10 to properly perform the comparison operation. In one embodiment, this timing circuit is implemented with a cascade of seventeen inverters to define the regeneration interval. This implementation allows the regeneration interval to track process, voltage and temperature (PVT) variations in the speed of comparator circuit 10. Alternatively, the regeneration interval can be defined using a replica comparator. For example, the replica comparator can be driven with a known fixed input signal that will cause a transition in the output signal. This transition can be used to trigger the end of the regeneration interval.

Output latch stage 14 is a differential latch clocked by control signal TRACKb. When control signal TRACKb is at a logic low level (i.e., comparator circuit 10 is in the tracking state, "tracking" the differential input signal) P-channel transistors 36 and 38 are turned on. In this embodiment, P-channel transistors 36 and 38 are fully turned on whereas N-channel transistors 28 and 30 are only weakly turned on, with their gate voltages near the NMOS threshold voltage, thereby pulling up the voltages at nodes 16 and 18. In other embodiments, P-channel transistors 36 and 38 can be made larger so as to be stronger than pull-down N-channel transistors to be able to pull up the voltages at nodes 16 and 18 against the action of the pull-down transistors. Consequently, inverters 40 and 42 generate logic low output signals. However, when control signal TRACKb is at a logic high level (i.e., comparator circuit 10 is in the compare state), P-channel transistors 36 and 38 are turned off, thereby allowing N-channel transistor 28 or 30 to pull down the voltage at either node 16 or node 18, depending on the relative voltage levels present at the gates of N-channel transistors 28 and 30 (i.e., nodes N2 and N3). The cross-coupled configuration of P-channel transistors 32 and 34 (the gate of P-channel transistor 32 is coupled to the drain of P-channel transistor 34 and vice versa) provides positive feedback once either N-channel transistor 28 or 30 begins pulling down the voltage at node 16 or node 18. In this manner, output latch stage quickly latches into a logic state that depends on the comparison of the voltages present at nodes N2 and N3. The voltages at nodes N2 and N3 depend on the comparison of input signals $V_{IN}+$ and $V_{IN}-$ as described below. Inverters 40 and 42 output the logic state of output latch stage 14 in the form of a differential signal, which can be stored in a flip-flop or other memory circuit (not shown).

Regenerative stage 12 generates the voltages at nodes N2 and N3 as follows. When control signal TRACK is at a logic high level (i.e., comparator circuit 10 is in the tracking state), P-channel transistor M1B is turned off and N-channel transistor M4 is turned on. As a result, only the quiescent current provided by P-channel transistor M1A biases node N1. Because N-channel transistor M4 is turned on, the voltages at nodes N2 and N3 are nearly equalized. Consequently, N-channel transistors M3A and M3B have nearly the same gate-to-source voltage, thereby pulling down the voltages at nodes N2 and N3 with about the same strength. The relatively sizes of transistors M1A, M1B, M3A and M3B are designed so that the voltage at node N1 is maintained at a relatively high voltage (i.e., near the level of the supply voltage VDD) while the voltages at nodes N2 and N3 are relatively low (i.e., slightly above the threshold voltage of M3A and M3B). By maintaining the voltages at nodes N1–N3 at these levels, the regeneration speed will be faster than that of the aforementioned dynamic comparators. During the tracking state, output latch stage 14 outputs logic low levels as described above.

Once input signals $V_{IN}+$ and $V_{IN}-$ have settled, control signal TRACK transitions from a logic high level to a logic low level. When control signal TRACK transitions to a logic low level, P-channel transistor M1B is turned on, thereby providing a dynamic current to node N1. This dynamic current increases the regeneration speed in a manner that is similar to a dynamic comparator, but even faster because the quiescent current provided by P-channel transistor M1A has maintained the voltage at node N1 at a higher level than in a dynamic comparator.

Further, the logic low level of control signal TRACK turns off N-channel transistor M4, thereby allowing the voltage levels at nodes N2 and N3 to separate in response to the different voltage levels of input signals $V_{IN}+$ and $V_{IN}-$. The positive feedback provided by the cross-coupled configuration of N-channel transistors M3A and M3B to quickly latch regenerative stage 12 into a logic state. The voltages at nodes N2 and N3 do not necessarily reach the supply rail voltages. For example, if the voltage level of input signal $V_{IN}+$ is higher than that of input signal $V_{IN}-$, P-channel transistor M2B will tend to pull up the voltage at node N3 to a higher level than P-channel transistor M2A can pull up the voltage at node N2. The higher voltage at node N3 increases the gate-to-source voltage of N-channel transistor M3A, which causes N-channel transistor M3A to pull down the voltage at node N2 more strongly (i.e., positive feedback). The lower voltage at node N2 decreases the gate-to-source voltage of N-channel transistor M3B, which causes N-channel transistor M3B to less conductive, thereby allowing P-channel transistor M2B to pull up the voltage at node N3 to a higher level. In this way, the voltage at node N2 is quickly pulled down toward that of the ground rail while the voltage at node N3 is quickly pulled up toward that of the supply rail.

In a similar but opposite manner, when the voltage level of input signal $V_{IN}+$ is lower than that of input signal $V_{IN}-$, regenerative stage 12 quickly latches the voltages at nodes N2 and N3 to logic high and logic low states, respectively.

Because complementary control signal TRACKb is at a logic high level during the compare state, the voltages at nodes N2 and N3 cause output stage 14 to latch into the appropriate logic state, as described previously.

Figure 3:
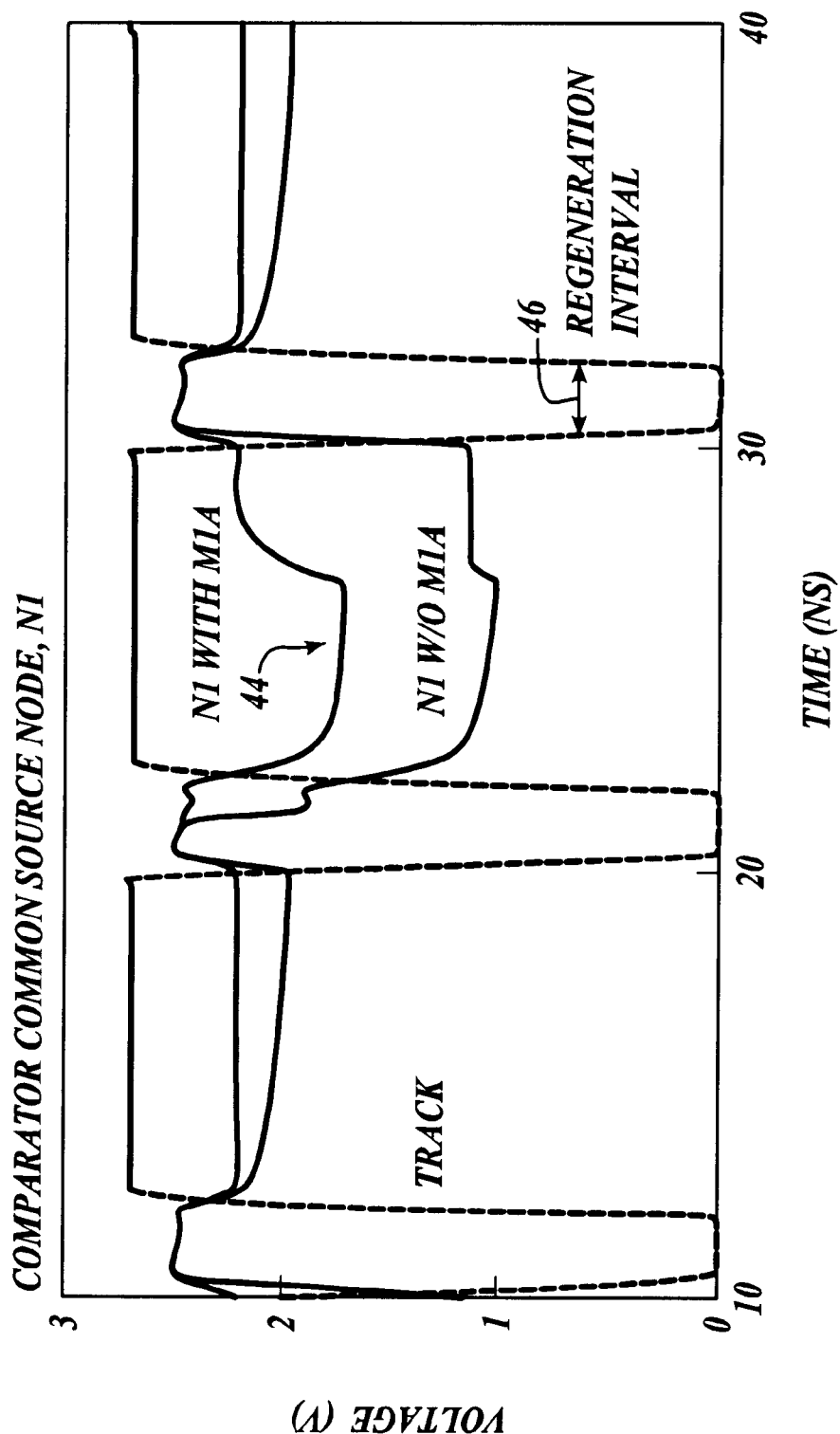
FIG. 3 is a diagram comparing the voltage at the common-source node of the regenerative stage of a dynamic comparator to that of the comparator circuit of FIG. 1.

FIG. 3 illustrates the voltage at node N1 of comparator circuit 10 (FIG. 1) during operation, as compared to a dynamic comparator. As indicated by an arrow 44, when control signal TRACK is at a logic high level, the voltage at node N1 is maintained at a higher level than would be present if P-channel transistor M1A were eliminated (i.e., resulting in a dynamic comparator). The irregular shape of segment 44 is due to the isolation scheme in that the gates M2A and M2B are grounded. If no isolation were used, the voltage at node N1 would appear more flat. As previously described, the higher voltage at node N1 during the tracking state allows the dynamic current to more quickly charge node N1 during the regeneration interval (indicated by an arrow 46), which tends to increase the regeneration speed.

Figure 4:
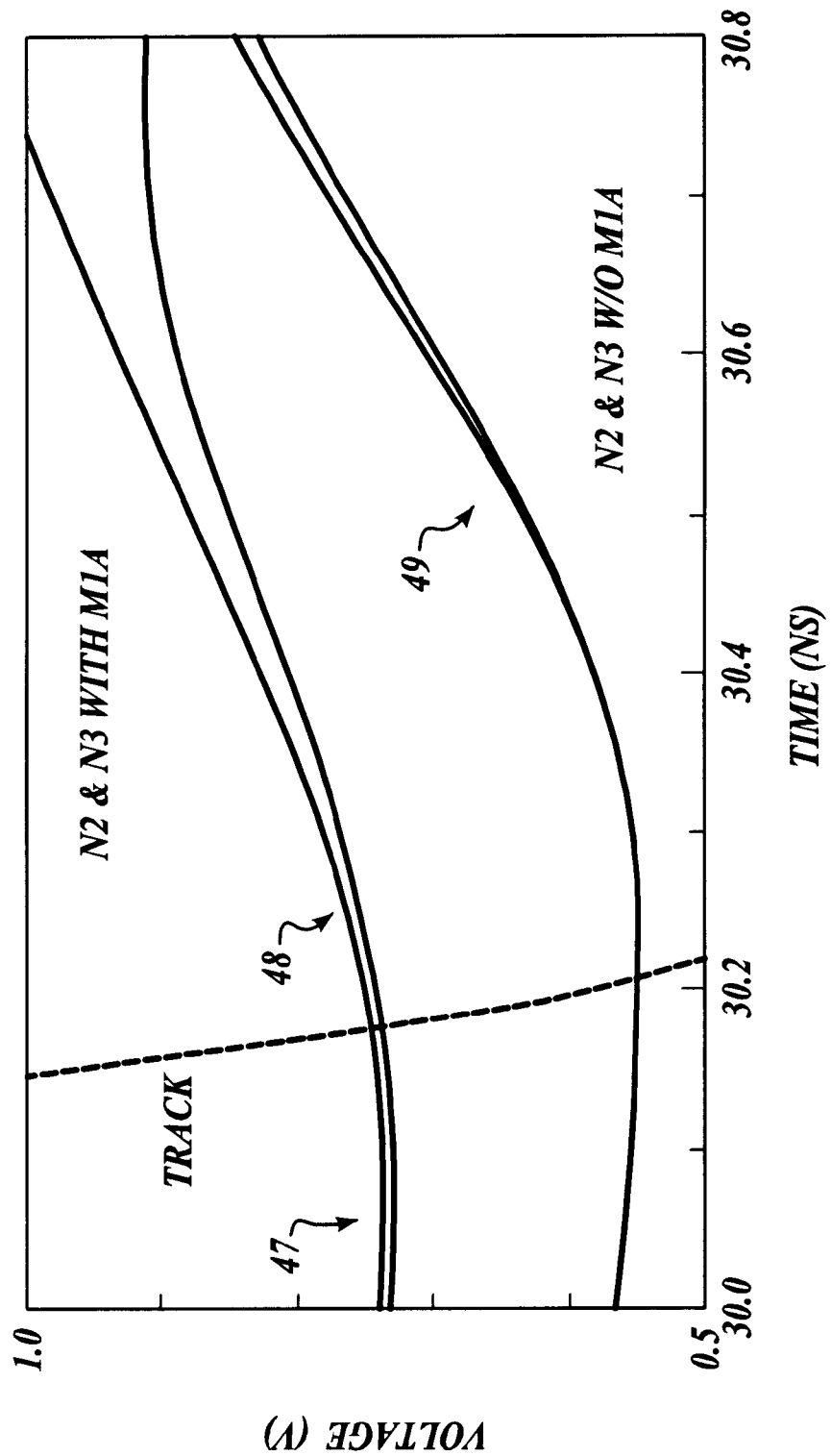
FIG. 4 is a diagram comparing the voltage at a drain node of source-coupled pair of the regenerative stage of a dynamic comparator to that of the comparator circuit of FIG. 1.

FIG. 4 illustrates the voltage at nodes N2 and N3 of comparator circuit 10 (FIG. 1) during operation, as compared to a dynamic comparator. As indicated by arrow 47, the voltage at nodes N2 and N3 are higher in comparator circuit 10 than would be present if a comparable dynamic comparator. This is because P-channel transistor M1A by being conductive allows P-channel transistors M2A and M2B to pull up the voltage at nodes N2 and N3 to some degree. In contrast, without P-channel transistor M1A, N-channel transistors M3A and M3B pull down the voltages at nodes N2 and N3 to about a threshold voltage above ground. Because the voltage levels at nodes N2 and N3 are relatively high, regenerative stage 12 can more quickly separate the voltage levels at nodes N2 and N3 (as indicated by arrow 48) in response to different voltage levels of input signals $V_{IN}+$ and $V_{IN}-$, compared to that in the dynamic comparator in which the separation occurs later as indicated by arrow 49.

Figure 5:
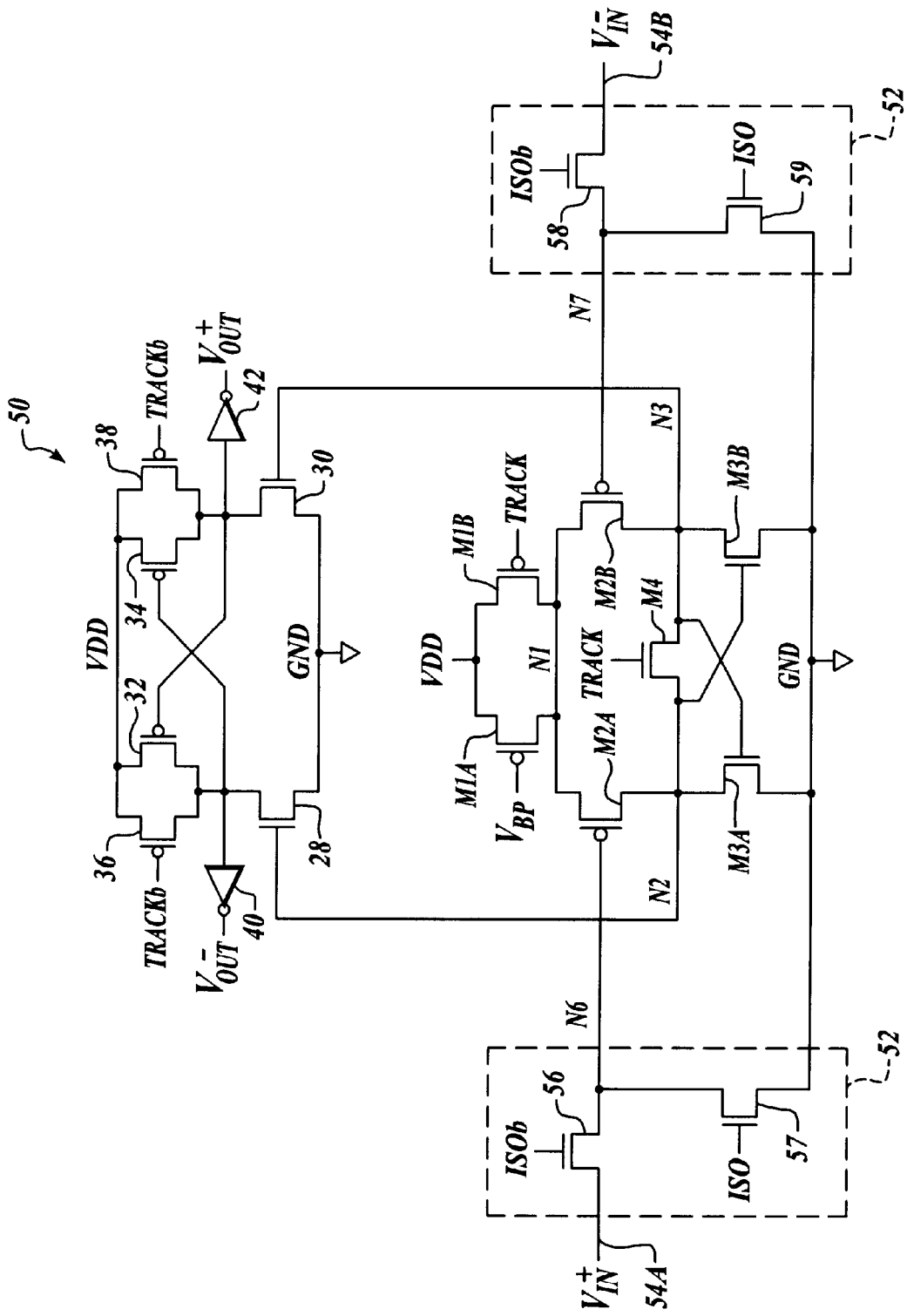
FIG. 5 is a diagram illustrating a comparator circuit according to another embodiment of the present invention.
Figure 6A:
FIG. 6 is a diagram illustrating signals provided to the comparator circuit of FIG. 5 during operation.
Figure 6B:
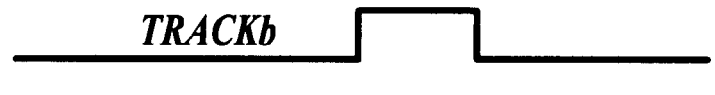
Figure 6C:
Figure 6D:
Figure 6E:
Figure 6F:

FIG. 5 illustrates a comparator circuit 50 according to another embodiment of the present invention. Comparator circuit 50 is essentially identical to comparator circuit 10 (FIG. 1), with the addition of an isolation circuit 52 connected to the gates of input P-channel transistors M2A and M2B. Isolation circuit 52 operates to isolate the gates of P-channel transistors M2A and M2B from lines 54A and 54B that carry input signals $V_{IN}+$ and $V_{IN}-$, shortly after the comparison state begins. In a further refinement, isolation circuit 52 also provides a fixed reference signals to the gates of P-channel transistors M2A and M2B, the fixed reference signals also being isolated from lines 54A and 54B.

In this embodiment, isolation circuit 52 is implemented N-channel transistor 56–59. N-channel transistor 56 is connected as a switch between line 54A and the gate of P-channel transistor M2A via a node N6, controlled by a control signal ISOb. N-channel transistor 57 is connected as a switch between node N6 and ground bus GND, controlled by a control signal ISO. N-channel transistor 58 is connected as a switch between line 54B and the gate of P-channel transistor M2B via a node N7, controlled by control signal ISOb. N-channel transistor 59 is connected as a switch between node N7 and ground bus GND, controlled by control signal ISO. Otherwise, comparator circuit 50 is implemented as described above for comparator circuit 10 (FIG. 1). The operation of comparator circuit 50 is described below in conjunction with FIG. 6.

FIG. 6 illustrates examples of signals TRACK, TRACKb, $V_{IN}+$, $V_{IN}-$, ISO and ISOb provided to comparator circuit 50 (FIG. 5) during operation. Referring to FIGS. 5 and 6, comparator circuit 50 operates as follows. Control signals ISO, ISOb, TRACK and TRACKb are generated by a timing circuit (not shown). Signals TRACK, TRACKb, $V_{IN}+$ and $V_{IN}-$ are provided as described above. The timing circuit (not shown) generates control signal ISO and its complement ISOb to transition shortly after each transition of control signals TRACK and TRACKb.

In one embodiment, control signal ISO transitions from a logic low level to a logic high level about 1 ns after control signal TRACK transitions from a logic high level to a logic low level. In other embodiments, the timing can be different provided the low-to-high transitions of control signal ISO occur after the high-to-low transitions of control signal TRACK long enough for the voltage levels at nodes N2 and N3 to begin to separate in response to the voltage levels of input signals $V_{IN}+$ and $V_{IN}-$. Once this separation begins, the positive feedback configuration of regenerative stage 12 quickly latches, whereby isolating nodes N6 and N7 from input signals $V_{IN}+$ and $V_{IN}-$ will have no significant effect on the voltages at nodes N2 and N3. While control signal ISO is at a logic high level (and thus complementary control signal ISOb is at a logic low level), N-channel transistors 56 and 58 are turned off, thereby isolating lines 54A and 54B from nodes N6 and N7. As a result, kick-back noise generated at nodes N6 and N7 (generated, for example during the comparison state or by transients generated when N-channel transistor M4 is turned on) is not passed to the circuitry (not shown) providing input signals $V_{IN}+$ and $V_{IN}-$.

In addition, N-channel transistors 57 and 59 are turned on while control signal ISO is at a logic high level. Consequently, the voltages at nodes N6 and N7 are essentially grounded, thereby preventing the gates of P-channel transistors M2A and M2B from floating (and possibly having a negative voltage). Although this technique draws a little more power during regeneration, the speed and consistency of the comparison state is improved.

As described above, control signal TRACK then transitions back to a logic high level to end the regeneration interval. The timing circuit (not shown) then causes control signal ISO to transition back to a logic low level about 4 ns after the low-to-high transition of control signal TRACK. This timing can be different in other embodiments, with the high-to-low transitions of control signal ISO preferably occurring with sufficient time before the next low-to-high transition of control signal TRACK to allow the quiescent current to charge node N1 to the desired level. The logic low level of control signal ISO turns off N-channel transistors 57 and 59 while the logic high level of complementary control signal ISOb turns on N-channel transistors 56 and 58. As a result, nodes N6 and N7 are then driven by input signals $V_{IN}+$ and $V_{IN}-$ so that comparator circuit 50 can then enter the tracking state as described above for comparator circuit 10 (FIG. 1).

The above specification, examples and data provide a complete description of the manufacture and use of the composition of the invention. In light of the present disclosure, many embodiments of the invention can be made without departing from the spirit and scope of the invention by those skilled in the art of comparator circuits. For example, although the described regenerative stage includes a PMOS source-coupled pair, NMOS source-coupled pair embodiments can be implemented by those skilled in the art without undue experimentation. Accordingly, the invention is not to be limited to those embodiments disclosed, but rather, the invention resides in the claims hereinafter appended.

I claim:

1. A comparator circuit that is configurable into a tracking state and a comparison state, the comparator circuit comprising:

a regenerative stage with a quiescent current source and a dynamic current source, the quiescent current source being configured to provide a quiescent current to charge a common-source node, the dynamic current source being configured to provide a dynamic current to charge the common-source node, wherein the quiescent current source is configured to be enabled during the tracking and comparison states, and wherein the dynamic current source is configured to be disabled during the tracking state and enabled during the comparison state, the regenerative stage being further configured to receive an input signal and generated in response thereto an intermediate signal during the comparison state having a logic state that is a function of a logic state of the input signal, the regenerative stage generating the intermediate signal at a rate that is dependent on the current provided to the common-source node; and an output latch stage coupled to receive the intermediate signal from the regenerative stage, wherein during the comparison state the output latch stage is configured to generate an output signal having a logic state that is a function of the logic state of the intermediate signal.

2. The circuit of claim 1 further comprising a dynamic bandgap reference coupled to the quiescent current source, wherein the dynamic bandgap reference is configurable to adjust a bias signal provided to the quiescent current source to adjust the current provided by the quiescent current source to the common-source node.

3. The circuit of claim 1 further comprising an isolation circuit coupled to the regenerative stage, wherein the isolation circuit is configured to isolate the regenerative stage from the input signal during a portion of the comparison state.

4. The circuit of claim 3 wherein the isolation circuit is further configured to provide a fixed reference signal to the regenerative stage during the portion of the comparison state.

5. The circuit of claim 3 wherein the isolation circuit is further configured to terminate the isolation after the comparison state ends.

6. A comparator circuit that is configurable into a tracking state and a comparison state, the comparator circuit comprising:

regenerative means, coupled to receive an input signal, for generating an intermediate signal during the comparison state having a logic state that is a function of a logic state of the input signal, the regenerative means generating the intermediate signal at a rate that is dependent on a current provided to a common-source node in the regenerative means, the regenerative means having a quiescent current source and a dynamic current source, the quiescent current source being configured to provide a quiescent current to charge the common-source node, the dynamic current source being configured to provide a dynamic current to charge the common-source node, wherein the quiescent current source is configured to be enabled during the tracking and comparison states, and wherein the dynamic current source is configured to be disabled during the tracking state and enabled during the comparison state; and output latch means, coupled to receive the intermediate signal from the regenerative stage, for generating during the comparison state an output signal having a logic state that is a function of the logic state of the intermediate signal.

7. The circuit of claim 6 further comprising a dynamic bandgap reference coupled to the quiescent current source, wherein the dynamic bandgap reference is configurable to adjust a bias signal provided to the quiescent current source to adjust the current provided by the quiescent current source to the common-source node.

8. The circuit of claim 6 further comprising isolation means, coupled to the regenerative means, for isolating the regenerative means from the input signal during a portion of the comparison state.

9. The circuit of claim 8 wherein the isolation means is further configured to provide a fixed reference signal to the regenerative means during the portion of the comparison state.

10. The circuit of claim 8 wherein the isolation means is further configured to terminate the isolation after the comparison state ends.

11. A comparator circuit that is configurable into a tracking state and a comparison state, the comparator circuit comprising:

an input circuit having a source-coupled pair of transistors and a common source node, the input circuit being configured to receive an input signal and generate in response thereto an intermediate signal during the comparison state having a logic state that is a function of a logic state of the input signal, the input circuit generating the intermediate signal at a rate that is dependent on a level of a current provided to the common-source node;

a quiescent current source coupled to the common-source node, the quiescent current source being configured to provide a quiescent current to charge the common-source node, wherein the quiescent current source is configured to be enabled during the tracking and comparison states a dynamic current source coupled to the common-source node, the dynamic current source being configured to provide a dynamic current to charge the common-source node, wherein the dynamic current source is configured to be disabled during the tracking state and enabled during the comparison state; and an output latch circuit coupled to receive the intermediate signal from the input circuit, wherein during the comparison state the output latch circuit is configured to generate an output signal having a logic state that is a function of the logic state of the intermediate signal.

12. The circuit of claim 11 further comprising a dynamic bandgap reference coupled to the quiescent current source, wherein the dynamic bandgap reference is configurable to adjust a bias signal provided to the quiescent current source to adjust the current provided by the quiescent current source to the common-source node.

13. The circuit of claim 11 further comprising an isolation circuit coupled to the source-coupled pair of transistors, wherein the isolation circuit is configured to isolate the source-coupled pair of transistors from the input signal during a portion of the comparison state.

14. The circuit of claim 13 wherein the isolation circuit is further configured to provide a fixed reference signal to the source-coupled pair of transistors during the portion of the comparison state.

15. The circuit of claim 13 wherein the isolation circuit is further configured to terminate the isolation after the comparison state ends.

* * * * *